United States Patent [19]

Hara et al.

[11] Patent Number: 6,083,018
[45] Date of Patent: Jul. 4, 2000

[54] MEMORY CARD CONNECTOR

[75] Inventors: Tomohisa Hara, Nagano, Japan; Ming-Chun Lai, Shin-Juang; Hung-Chi Yu, Hsi-Chih, both of Taiwan

[73] Assignee: Hon Hai Precision Ind. Co., Ltd., Taipei Hsien, Taiwan

[21] Appl. No.: 09/305,864

[22] Filed: May 5, 1999

[30] Foreign Application Priority Data

Feb. 5, 1999 [TW] Taiwan ................................. 88201929

[51] Int. Cl.[7] .................................................. H01R 13/62
[52] U.S. Cl. ................................................................ 439/159
[58] Field of Search .................................... 439/159, 152, 439/155, 541.5

[56] References Cited

U.S. PATENT DOCUMENTS

| 5,197,894 | 3/1993 | Koike | 439/159 |
|---|---|---|---|
| 5,533,906 | 7/1996 | Abe | 439/159 |
| 5,713,750 | 2/1998 | Ho | 439/159 |

*Primary Examiner*—Khiem Nguyen
*Assistant Examiner*—Brian S. Webb
*Attorney, Agent, or Firm*—Wei Te Chung

[57] ABSTRACT

A memory card connector for electrically connecting a memory card and a circuit board comprises a dielectric housing, a number of contacts received in the housing, a shell enclosing the housing and an ejector comprising a push rod, an actuator and an ejection plate. The shell forms a securing section bend a specific angle from a front edge of the shell thereby defining a receiving space for facilitating the actuator to pivot and the ejection plate to move therein when a mating memory card are inserted into or withdrawn from the shell.

6 Claims, 7 Drawing Sheets

MEMORY CARD CONNECTOR

BACKGROUND OF THE INVENTION

The present invention relates to a memory card connector, and particularly to a memory card connector for facilitating a smooth sliding movement of an ejection plate during insertion of a memory card into the memory card connector.

Referring to FIGS. 1, 2 and 3, a conventional memory card connector mainly comprises a dielectric housing 90, a plurality of contacts 91 received in the housing 90, a shell 92 and an ejector 93. The ejector 93 comprises a push rod 930, an actuator 931 and an ejection plate 932 assembled together. The actuator 931 forms a circular projection 935 for pivotally engaging with a corresponding hole 921 of the shell 92, a resilient tab 936 at a free end thereof and a latching aperture 938 therein. A recess 922 is defined in the shell and defines an arcuate slot 9220 at a lateral side edge. When the push rod 930 is driven in an elongate direction along the memory card connector, the actuator 931 will pivot abut the projection 935, while the resilient tab 936 slides in the arcuate slot 9220. Simultaneously, the ejection plate 932 will push a mating memory card out of the memory card connector along the elongate direction by a driving force exerted by a securing bar 937 formed on the ejection plate 932 and engaged within the latching aperture 938 of the actuator 931. Thus, the mating memory card is ejected from the memory card connector by means of the pivotal movement of the actuator 931.

In order to prevent the actuator 931 from separating from the shell due to disengagement between the circular projection 935 and the hole 921 under an over-exertion force acting thereon, a top flange of the shell 92 is bent to form a securing section 923. The securing section 923 has a bottom edge 924 parallel to the shell 92 thereby defining a receiving space for receiving an edge of the actuator 931 and the ejection plate 932.

However, the securing section 923 requires a multi-bending process thereby complicating manufacture and occupying unnecessary space within the memory card connector. Moreover, the securing section 923 strictly limits a vertical dimension of the shell 92. If the vertical dimension is larger than required, a gap will exist between the actuator 931 and the ejection plate 932 thereby causing the actuator 931 to become easily disengaged from the shell 92. If the vertical dimension of the shell 92 is smaller than required, the actuator 931 will constrict the ejection plate 932 and the shell 92 resulting in increasing friction between the actuator 931, the ejection plate 932 and the shell 92 thereby hindering insertion or withdrawal of the mating memory card with the memory card connector. In a more serious case, if the vertical dimension of the shell 92 is so small that the receiving space defined in the securing section 923 is unable to receive the actuator 931 and the ejection plate 932 therein, the ejection plate 932 will abut against the bottom edge 924 of the securing section 923 when inserting the mating memory card into the memory card connector.

BRIEF SUMMARY OF THE INVENTION

A main object of the present invention is to provide a memory card connector comprising a shell having a securing section defining an open receiving space for ensuring proper insertion and withdrawal of a memory card.

Another object of the present invention is to provide a memory card connector which promotes an efficient use of space.

A further object of the present invention is to provide a memory card connector which is easily manufactured.

In accordance with one aspect of the present invention, a memory card connector comprises a dielectric housing, a plurality of contacts received in the housing, a shell enclosing the housing and an ejector comprising a push rod, an actuator and an ejection plate pivotally assembled together. The shell forms a securing section at a front edge proximate mating ends of the contacts. The securing section acutely extends from a front edge of the shell thereby forming receiving space having an appropriate angle relative to a elongate direction along the shell for the actuator and the ejection plate to freely move therein. The angle between the shell and the securing section should lie within the range of 80–85 degrees thereby eliminating the possibility of the actuator becoming disengaged from the shell when the memory card is inserted into or withdrawn from the memory card connector.

Other objects, advantages and novel features of the invention will become more apparent from the following detailed description when taken in conjunction with the accompanying drawings.

DETAILED DESCRIPTION OF THE INVENTION

Figure 1:
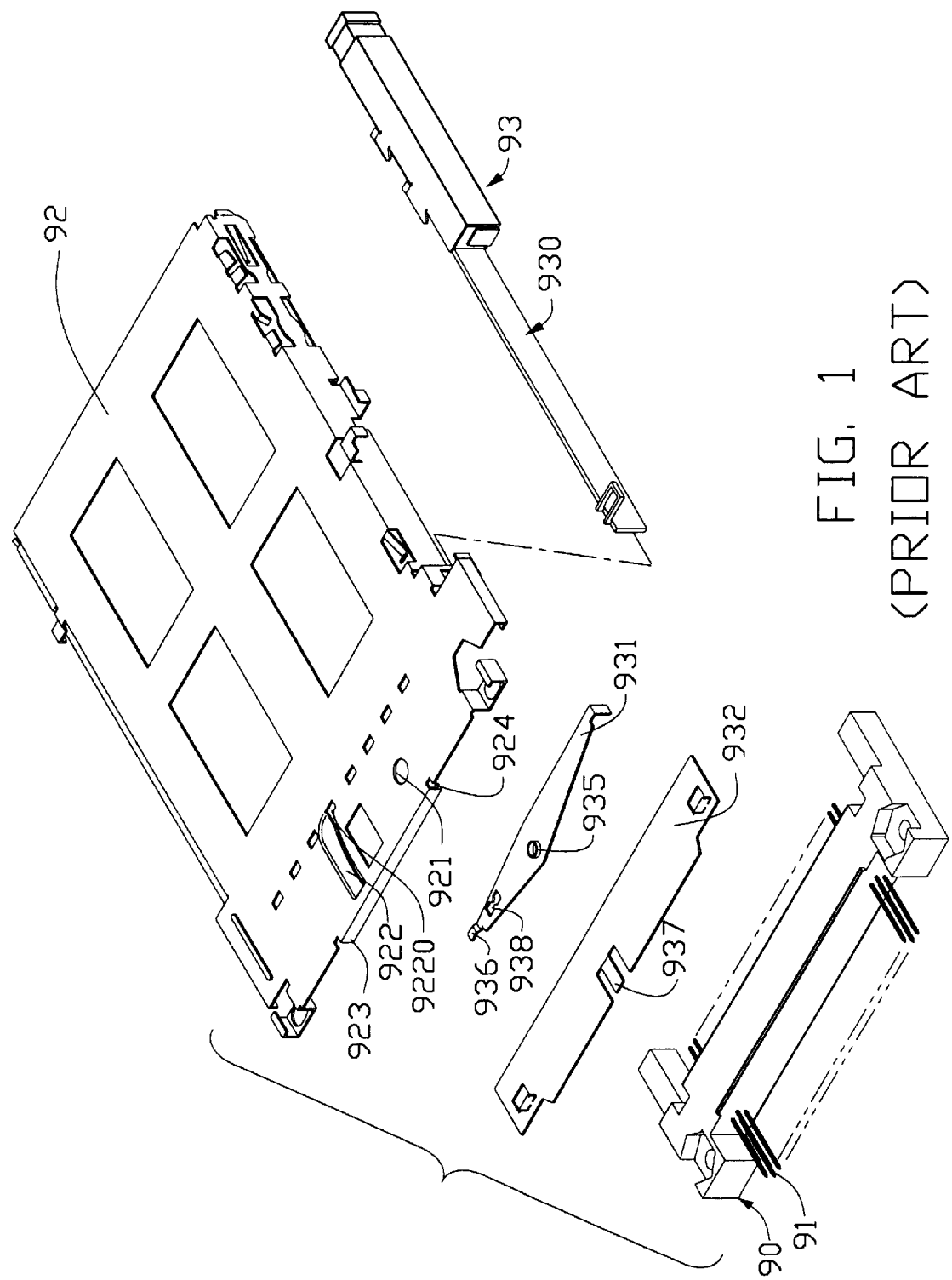
FIG. 1 is an exploded view of a conventional memory card connector.
Figure 2:
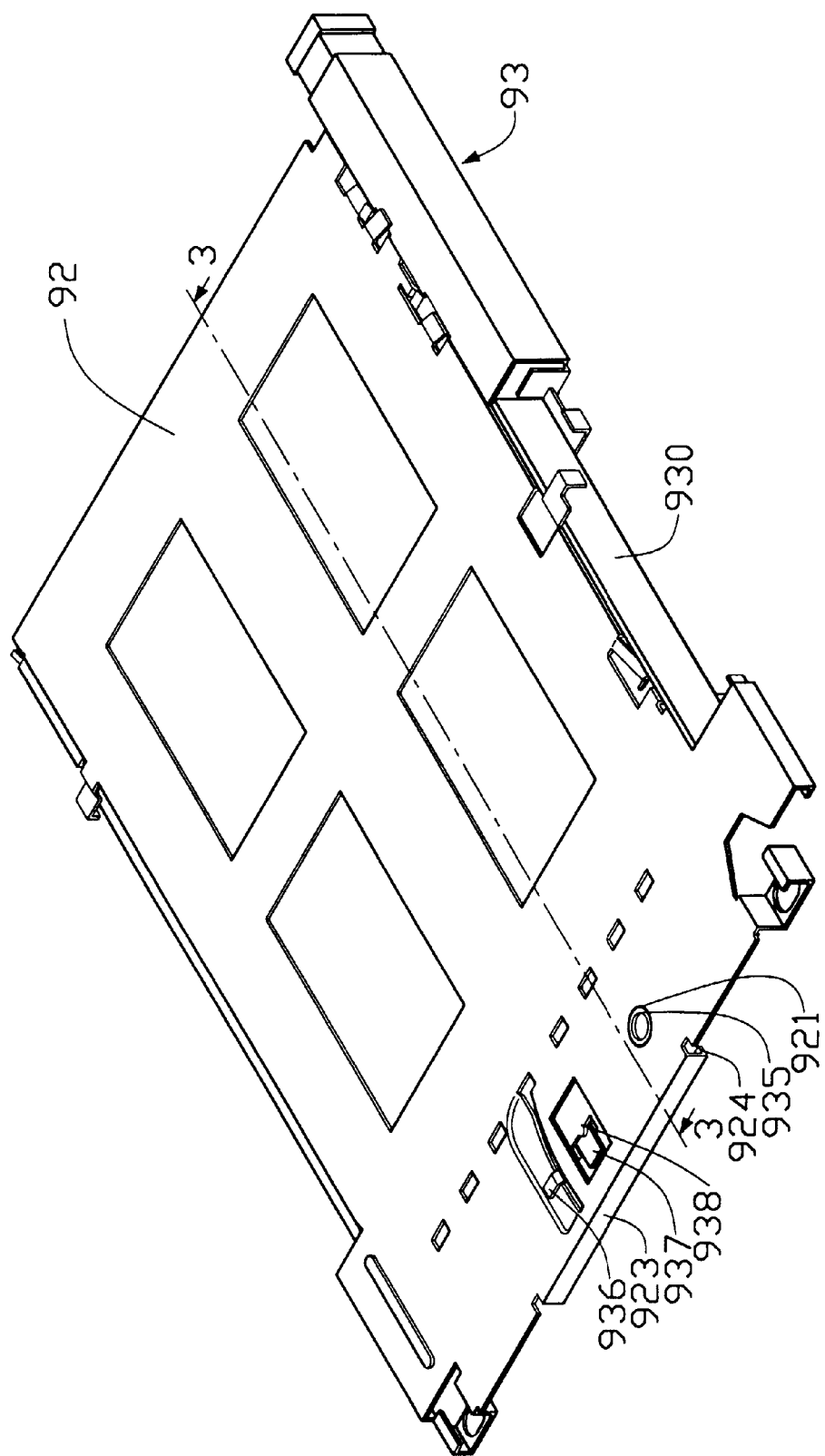
FIG. 2 is an assembled view of FIG. 1 with a housing and contacts thereof being removed.
Figure 3:
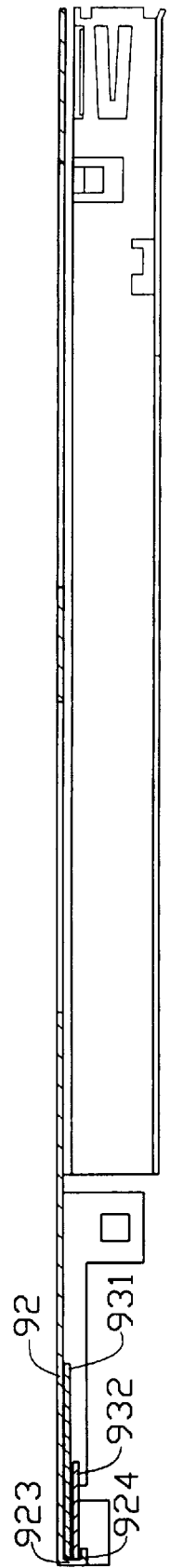
FIG. 3 is a cross-sectional view taken along 3—3 line of FIG. 2.
Figure 4:
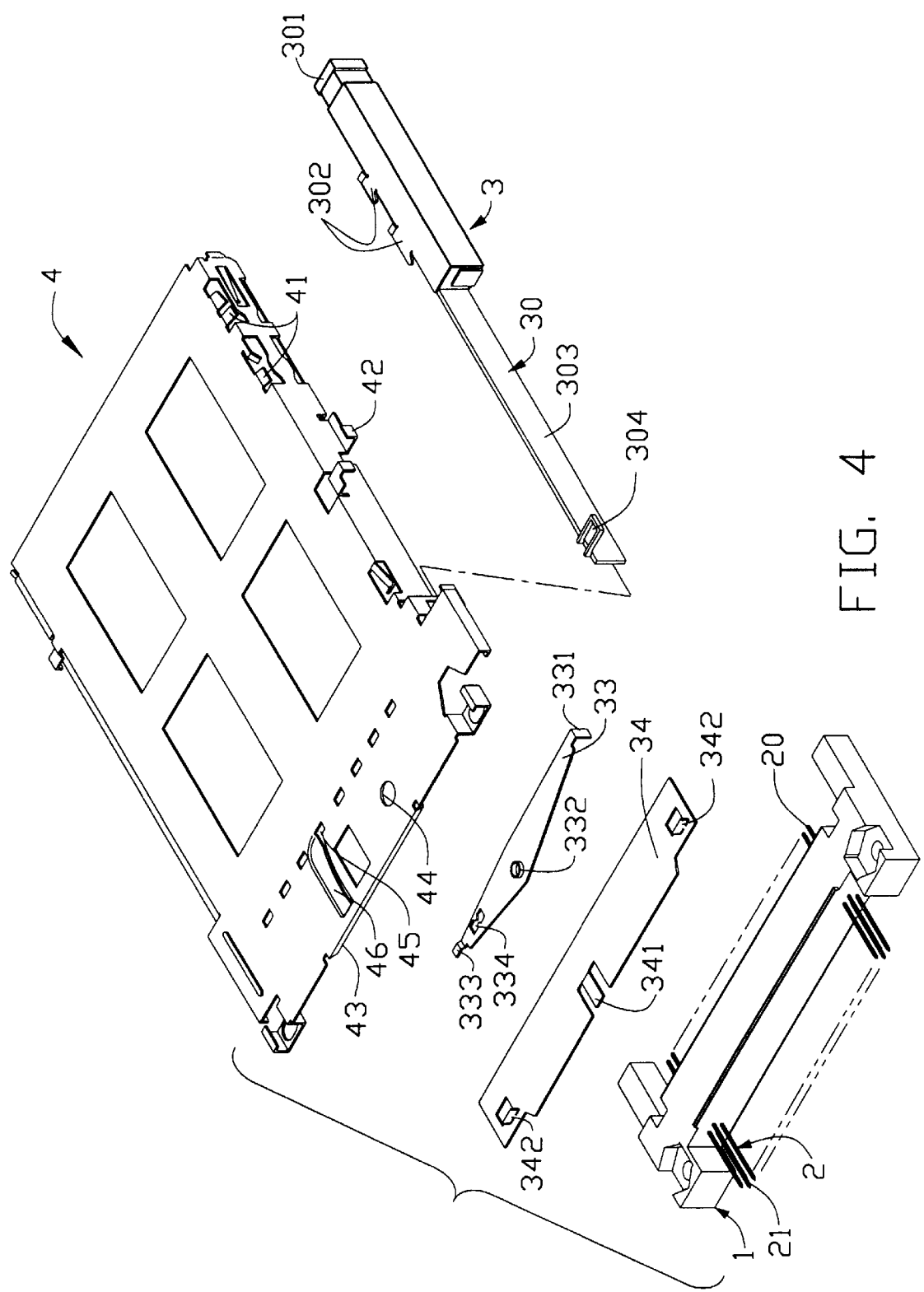
FIG. 4 is an exploded view of a memory card connector in accordance with the present invention.

Referring to FIG. 4, an electrical memory card connector in accordance with the present invention comprises a dielectric housing 1, a plurality of contacts 2, an ejector 3 and a shell 4 enclosing the housing 1. Each contact 2 comprises a mating end 20 for mating with a memory card and a soldering end 21 for electrically connecting with a circuit board. The ejector 3 comprises a push rod 30, an actuator 33 and an ejection plate 34 assembled together. The shell 4 has a main portion for enclosing the housing 1, a second portion including opposite side walls (not labeled) defining a space therebetween for guiding and receiving a mating memory card therein, and a third portion for securing the ejector 3 thereto.

Figure 5:
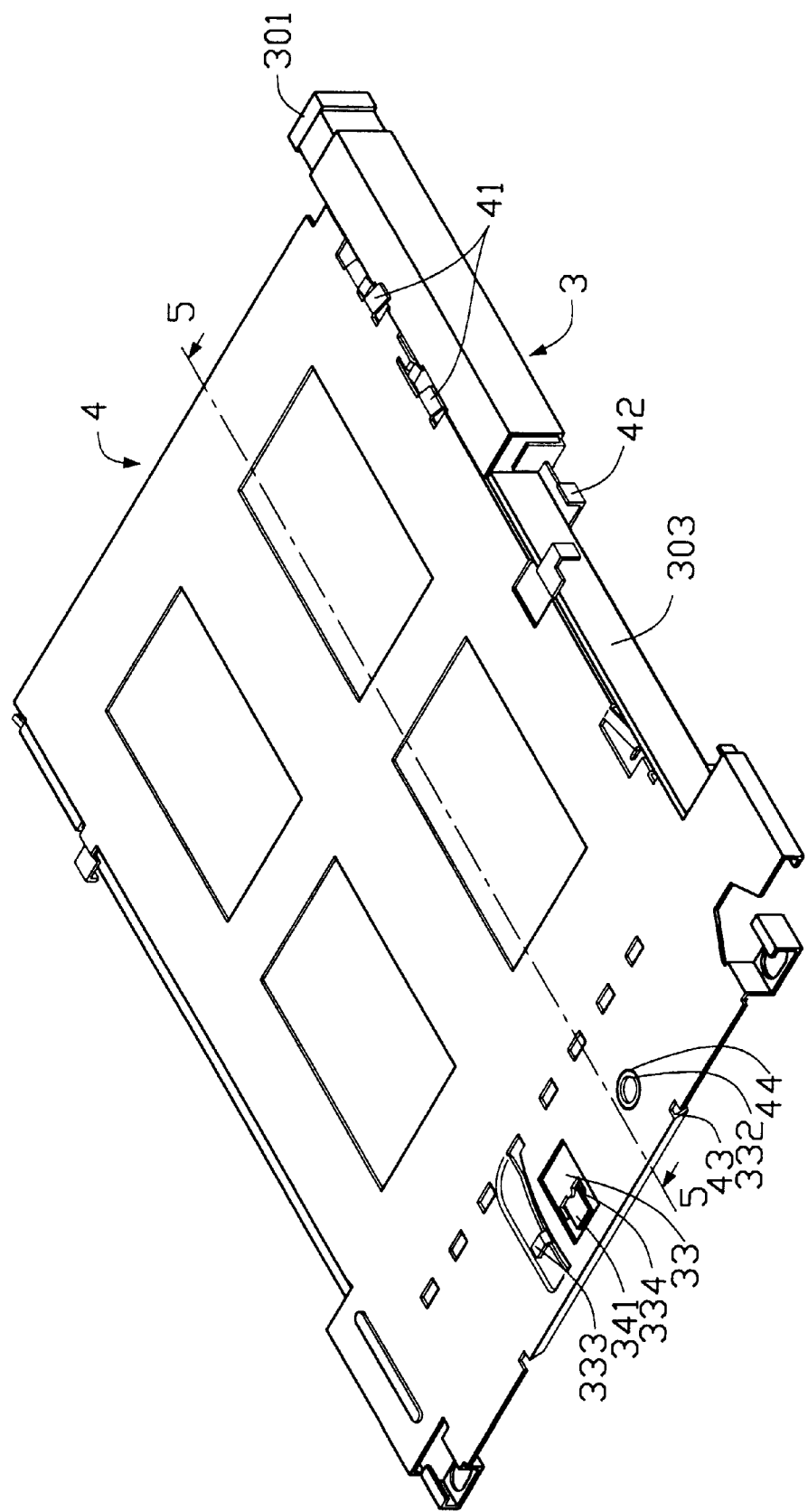
FIG. 5 is an assembled view of FIG. 4 with a housing and contacts thereof being removed.

Referring also to FIG. 5, the push rod 30 of the ejector 3 is elongate and comprises a button 301 and a lever section 303. The button 301 forms a pair of securing clasp 302 on an edge proximate the shell 4. The lever section 303 defines a rectangular aperture 304 at a free end opposite the button 301. The actuator 33 forms a circular projection 332 proximate a middle portion thereof, a latching flap 331 at one end thereof for engaging with the rectangular aperture 304 of the lever section 303, a resilient tab 333 at an opposite end thereof and a latching aperture 334 proximate the resilient tab 333. The ejection plate 34 forms a latching arm 341 for engaging with the latching aperture 334 and a pair of push tabs 342 at opposite ends thereof for pushing or abutting against the mating memory card.

The shell 4 forms a planar top section (not labeled), a pair of latching bars 41 on one side wall of the planar top section proximate the ejector 3 for engaging with the securing clasps 302 of the ejector 3, a support 42 on the same side wall for engaging with the lever section 303 and a securing section 43 on a front edge of the top section, the securing section 43 being in the form of a planar tab and cooperating with the top section to define a receiving space for receiving the actuator 33, the ejection plate 34 and the mating memory card.

The securing section 43 is easily stamped and formed from a raw sheet and is bent a specific angle from the front edge of the top section of the shell 4. The angle falls within the range of 80 degrees to 85 degrees. The height of the securing section 43 is slightly larger than a total thickness of the actuator 33 plus the ejection plate 34. Thus, the receiving space provided by the securing section 43 ensures that front edges of the ejection plate 34 and the actuator 33 can be retained in position, and moreover, since the securing section 43 is in the form of a planar tab with a free end pointing downwards (best seen in FIGS. 6 and 7) without a rearward extension of the admitted prior art, the front edge of the ejection plate 24 can be smoothly moved into the receiving space until it is stopped by the securing section 43 (best seen in FIG. 7). when a mating memory card is inserted into the memory card connector.

A hole 44 is defined proximate a front edge of the main portion of the shell 4 for pivotally receiving the projection 332 therein. A recess 46 is integrally defined near the hole 44 and defines an arcuate slot 45 at a lateral side edge for slidably engaging the resilient tab 333 of the actuator 33 therein.

Figure 6:
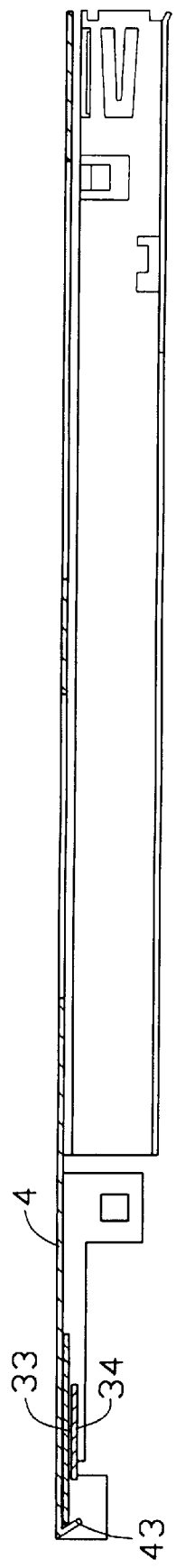
FIG. 6 is a cross-sectional view taken along line 6—6 of FIG. 5 before insertion of a mating card.
Figure 7:
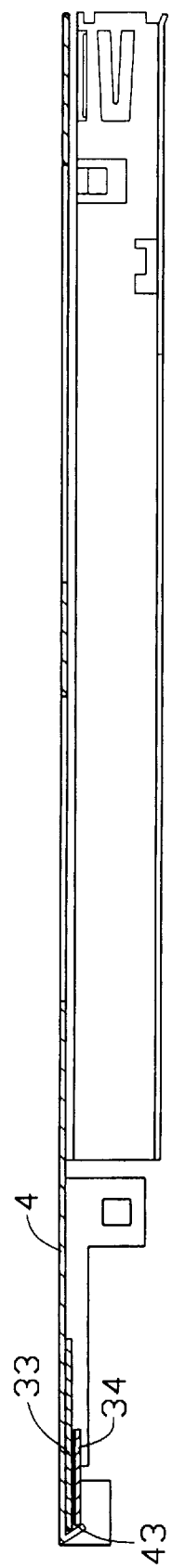
FIG. 7 is a view similar to FIG. 6 after insertion of the mating card.

Referring to FIGS. 4, 6 and 7, when the mating memory card is inserted into the memory card connector in an elongate direction from an end of the shell 4 toward the housing 1, the memory card will abut against the push tab 342 of the ejection plate 34 and force the ejection plate 34 via the engagement between the latching arm 341 of the ejection plate 34 and the latching aperture 334 of the actuator 33 to push the actuator 33 which pivots about the projection 332. Thus, the mating memory card engages with the mating ends 20 of the contacts 2. The front edge of the actuator 33 is retained in the receiving space defined by the planar securing section 43 and the top section of the shell 4, and the front edge of the ejection plate 34 is driven to enter into the receiving space to abut against the securing section 43 while the lever section 303 of the push rod 30 moves an elongate distance away from the housing 1.

When a force is exerted on the button 301, the button 301 will push the lever section 303 to move toward the housing 1 and push the latching flap 331 by means of the rectangular aperture 304. Thus, the actuator 33 pivots about the projection 332, and the ejection plate 34 simultaneously moves along the lever section 303 away from the housing 1. Therefore, the memory card and the edge flange of the ejection plate 34 are removed from the receiving space of the securing section 43 without disengaging from the securing section 43 during the withdrawal process.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the fall extent indicated by the broad general meaning of the terms in which the appended claims are expressed.

What is claimed is:

1. A memory card connector comprising:

a dielectric housing;

a plurality of contacts received in the dielectric housing, each contact comprising a mating end for mating with a memory card and a soldering end for electrically connecting with a circuit board;

an ejector comprising a push rod, an actuator and an ejection plate; and a shell covering the dielectric housing and forming a top section and a securing section in a form of a tab extending from an edge of the top section with a free end pointing downwards, the securing section being bent an acute angle relative to the top section to form a receiving space for retaining a front edge of the actuator, and a front edge of the ejection plate as the actuator and the ejection plate are moved into the receiving space during insertion of the memory card into the memory card connector, the actuator and the ejection plate are stopped by the securing section.

2. The memory card connector as claimed in claim 1, wherein the acute angle between the securing section and the top section of the shell is in a range of 80–85 degrees.

3. The memory card connector as claimed in claim 1, wherein a height of the securing section with respect to the top section of the shell is slightly larger than a total thickness of the actuator plus the ejection plate.

4. The memory card connector as claimed in claim 1, wherein the actuator of the ejector forms a latching flap on one end thereof for engaging with a corresponding aperture defined in the push rod, a tab on an opposite end thereof for slidably engaging with an arcuate slot defined in the shell, and a projection on approximately a middle portion thereof for pivotally engaging within a hole defined in the shell.

5. The memory card connector as claimed in claim 1, wherein the ejection plate of the ejector is disposed under the actuator and forms a latching arm for engaging with a latching aperture defined in the actuator.

6. A memory card connector comprising:

a dielectric housing;

a plurality of contacts received in the dielectric housing, each contact comprising a mating end for mating with a memory card and a soldering end for electrically connecting with a circuit board;

an ejector comprising a push rod, and an actuator and an ejection plate; and a shell covering the dielectric housing and forming a planar top section and a securing section in a form of a tab with a free end pointing downwards, said securing section being bent with an acute angle relative to the top section and extending downward from an edge of the top section a fixed distances said securing section abutting against front edges of both the actuator and the ejection plate when the memory card is inserted into the housing, thereby driving the ejection plate to move toward the securing section.

* * * * *